(12) United States Patent
Chen et al.

(10) Patent No.: US 9,553,150 B2
(45) Date of Patent: Jan. 24, 2017

(54) TRANSISTOR DESIGN

(71) Applicant: Taiwan Semiconductor Manufacturing Co., Ltd., Hsin-Chu (TW)

(72) Inventors: Wen-Yuan Chen, Yangmei (TW); Tsung-Hsing Yu, Taipei (TW); Ken-Ichi Goto, Hsin-Chu (TW); Zhiqiang Wu, Chubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/880,469

(22) Filed: Oct. 12, 2015

(65) Prior Publication Data

US 2016/0035832 A1    Feb. 4, 2016

Related U.S. Application Data

(63) Continuation of application No. 14/156,546, filed on Jan. 16, 2014, now Pat. No. 9,184,234.

(51) Int. Cl.
*H01L 21/00* (2006.01)
*H01L 29/00* (2006.01)
(Continued)

(52) U.S. Cl.
CPC ..... *H01L 29/1054* (2013.01); *H01L 21/02529* (2013.01); *H01L 21/02532* (2013.01);
(Continued)

(58) Field of Classification Search
CPC ............. H01L 29/1054; H01L 29/1095; H01L 29/6659; H01L 29/66492; H01L 29/41725; H01L 29/365; H01L 29/1608; H01L 29/165; H01L 29/167; H01L 29/66651; H01L 29/105; H01L 29/1083; H01L 29/0653; H01L 29/66477; H01L 21/26513; H01L 21/26586; H01L 21/02529; H01L 21/02532; H01L 21/76224

See application file for complete search history.

(56) References Cited

U.S. PATENT DOCUMENTS

| | | |
|---|---|---|
| 5,355,006 A | 10/1994 | Iguchi |
| 5,561,302 A | 10/1996 | Candelaria |

(Continued)

FOREIGN PATENT DOCUMENTS

| | | |
|---|---|---|
| KR | 20100080159 A | 7/2010 |
| KR | 20130049450 A | 5/2013 |
| TW | 201349304 A | 12/2013 |

OTHER PUBLICATIONS

Non Final Office Action Dated Nov. 27, 2015 U.S. Appl. No. 14/156,496.

(Continued)

*Primary Examiner* — Nikolay Yushin
(74) *Attorney, Agent, or Firm* — Eschweiler & Associates, LLC

(57) ABSTRACT

Some embodiments of the present disclosure relate to a transistor device formed in a semiconductor substrate containing dopant impurities of a first impurity type. The transistor device includes channel composed of a delta-doped layer comprising dopant impurities of the first impurity type, and configured to produce a peak dopant concentration within the channel. The channel further includes a layer of carbon-containing material overlying the delta-doped layer, and configured to prevent back diffusion of dopants from the delta-doped layer and semiconductor substrate. The channel also includes of a layer of substrate material overlying the layer of carbon-containing material, and configured to achieve steep retrograde dopant concen- (Continued)

tration profile a near a surface of the channel. In some embodiments, a counter-doped layer underlies the delta-doped layer configured to reduce leakage within the semiconductor substrate, and includes dopant impurities of a second impurity type, which is opposite the first impurity type.

20 Claims, 11 Drawing Sheets

(51) Int. Cl.
| | | |
|---|---|---|
| H01L 29/10 | (2006.01) | |
| H01L 29/78 | (2006.01) | |
| H01L 29/66 | (2006.01) | |
| H01L 29/417 | (2006.01) | |
| H01L 29/36 | (2006.01) | |
| H01L 29/16 | (2006.01) | |
| H01L 29/165 | (2006.01) | |
| H01L 21/265 | (2006.01) | |
| H01L 29/167 | (2006.01) | |
| H01L 21/02 | (2006.01) | |
| H01L 21/762 | (2006.01) | |
| H01L 29/06 | (2006.01) | |

(52) U.S. Cl.
CPC .. *H01L 21/26513* (2013.01); *H01L 21/26586* (2013.01); *H01L 21/76224* (2013.01); *H01L 29/0653* (2013.01); *H01L 29/105* (2013.01); *H01L 29/1083* (2013.01); *H01L 29/1095* (2013.01); *H01L 29/165* (2013.01); *H01L 29/167* (2013.01); *H01L 29/1608* (2013.01); *H01L 29/365* (2013.01); *H01L 29/41725* (2013.01); *H01L 29/6659* (2013.01); *H01L 29/66477* (2013.01); *H01L 29/66492* (2013.01); *H01L 29/66651* (2013.01); *H01L 29/78* (2013.01); *H01L 29/7833* (2013.01)

(56) References Cited

U.S. PATENT DOCUMENTS

| | | |
|---|---|---|
| 6,040,208 A | 3/2000 | Honeycutt et al. |
| 6,215,148 B1 | 4/2001 | Eitan |
| 6,541,343 B1 | 4/2003 | Murthy et al. |
| 6,566,204 B1 | 5/2003 | Wang et al. |
| 6,589,847 B1 | 7/2003 | Kadosh et al. |
| 6,849,890 B2 | 2/2005 | Kokubun |
| 7,276,407 B2 | 10/2007 | Yamagata et al. |
| 7,507,999 B2 | 3/2009 | Kusumoto et al. |
| 7,943,468 B2 | 5/2011 | Curello et al. |
| 7,952,149 B2 | 5/2011 | Dokumaci et al. |
| 8,034,679 B1 | 10/2011 | Bulucea |
| 8,298,895 B1 | 10/2012 | Alptekin |
| 8,404,546 B2 | 3/2013 | Woon et al. |
| 8,557,659 B2 | 10/2013 | Teo et al. |
| 8,569,156 B1 | 10/2013 | Scudder et al. |
| 8,659,054 B2 | 2/2014 | Rim et al. |
| 8,669,615 B1 | 3/2014 | Chang et al. |
| 9,224,814 B2 | 12/2015 | Yu et al. |
| 2002/0033511 A1 | 3/2002 | Babcock et al. |
| 2003/0008484 A1 | 1/2003 | Hook |
| 2003/0075719 A1 | 4/2003 | Sriram |
| 2005/0023535 A1 | 2/2005 | Sriram |
| 2005/0173739 A1 | 8/2005 | Kusumoto et al. |
| 2005/0285212 A1 | 12/2005 | Tolchinsky et al. |
| 2006/0065937 A1 | 3/2006 | Hoffmann et al. |
| 2006/0220098 A1 | 10/2006 | Lee et al. |
| 2007/0190731 A1 | 8/2007 | Chen et al. |
| 2008/0195983 A1 | 8/2008 | Chidambarrao et al. |
| 2008/0242032 A1 | 10/2008 | Chakravarthi et al. |
| 2008/0272395 A1 | 11/2008 | Banna |
| 2009/0289280 A1 | 11/2009 | Zhang et al. |
| 2010/0317169 A1 | 12/2010 | Sung et al. |
| 2010/0330763 A1 | 12/2010 | Freeman et al. |
| 2011/0031503 A1 | 2/2011 | Doris et al. |
| 2011/0079861 A1 | 4/2011 | Shifren et al. |
| 2011/0215376 A1 | 9/2011 | Holt et al. |
| 2012/0135575 A1 | 5/2012 | Wong et al. |
| 2013/0113041 A1 | 5/2013 | Liu et al. |
| 2014/0197411 A1 | 7/2014 | Vakada et al. |
| 2014/0252504 A1 | 9/2014 | Chuang et al. |
| 2015/0243759 A1 | 8/2015 | Huang et al. |
| 2015/0263092 A1 | 9/2015 | Hsiao et al. |
| 2015/0295085 A1 | 10/2015 | Yu et al. |

OTHER PUBLICATIONS

Streetman, et al. "Solid State Electronic Devices." Fifth Edition. Published in 2000. pp. 311-315.
U.S. Appl. No. 14/156,496, filed Jan. 16, 2014. 27 Pages.
U.S. Appl. No. 14/156,505, filed Jan. 16, 2014. 23 Pages.
U.S. Appl. No. 14/156,515, filed Jan. 16, 2014. 31 Pages.
U.S. Appl. No. 14/208,353, filed Mar. 13, 2014.
Chih-Cheng Lu, et al.; "Strained Silicon Technology: Mobility Enhancement and Improved Short Channel Effect Performance by Stress Memorization Technique on nFET Devices"; Journal of the Electrochemical Society; Oct. 8, 2009, p. 1-4.
S. Flachowsky, et al.; "Stress Memorization Technique for n-MOSFETs: Where is the Stress Memorized?"; ULIS 2010—Ultimate Integration on Silicon; University of Glasgow; Mar. 2010; p. 1-4.
Nuo Xu; "Effectiveness of Strain Solutions for Next-Generation MOSFETs"; University of California—Berkley; Spring 2012; p. 1-103.
Shen, et al. "Molecular Dynamic Simulation Study of Stress Memorization in Si Dislocations." IEEE International Conference: Electron Devices Meeting (IEDM), 2012.
U.S. Appl. No. 13/288,201, filed Nov. 3, 2011.
U.S. Appl. No. 14/252,147, filed Apr. 14, 2014.
Non Final Office Action Dated May 15, 2015 U.S. Appl. No. 14/156,515.
Notice of Allowance Dated Jul. 24, 2015 U.S. Appl. No. 14/252,147.
Non Final Office Action Dated Feb. 23, 2015 U.S. Appl. No. 14/156,546.
Notice of Allowance Dated Jun. 26, 2015 for U.S. Appl. No. 14/156,546.
Notice of Allowance Dated Aug. 27, 2015 U.S. Appl. No. 14/156,515.
Non Final Office Action Dated Aug. 28, 2015 U.S. Appl. No. 14/208,353.
Notice of Allowance Dated Sep. 9, 2015 U.S. Appl. No. 14/156,505.
Notice of Allowance Dated Mar. 28, 2016 U.S. Appl. No. 14/208,353.
Notice of Allowance Dated Jul. 14, 2016 U.S. Appl. No. 14/880,392.
Non Final Office Action Dated Oct. 13, 2016 U.S. Appl. No. 14/935,760.

TRANSISTOR DESIGN

REFERENCE TO RELATED APPLICATION

This Application is a Continuation of U.S. application Ser. No. 14/156,546, filed on Jan. 16, 2014, the contents of which are incorporated by reference in their entirety.

BACKGROUND

A modern integrated circuit (IC) manufactured on a semiconductor substrate contains millions or even billions of transistors. Performance of the IC is dependent upon matching physical and electronic properties of the transistors. As the minimum gate length of the transistors continues to scale, variation substrate properties, transistor dimensions, or in the geometries or composition of the various components and constituents of each transistor can create an electronic mismatch between transistors within the IC. These effects can degrade device performance and reduce yield of the IC.

DETAILED DESCRIPTION

Figure 1A:
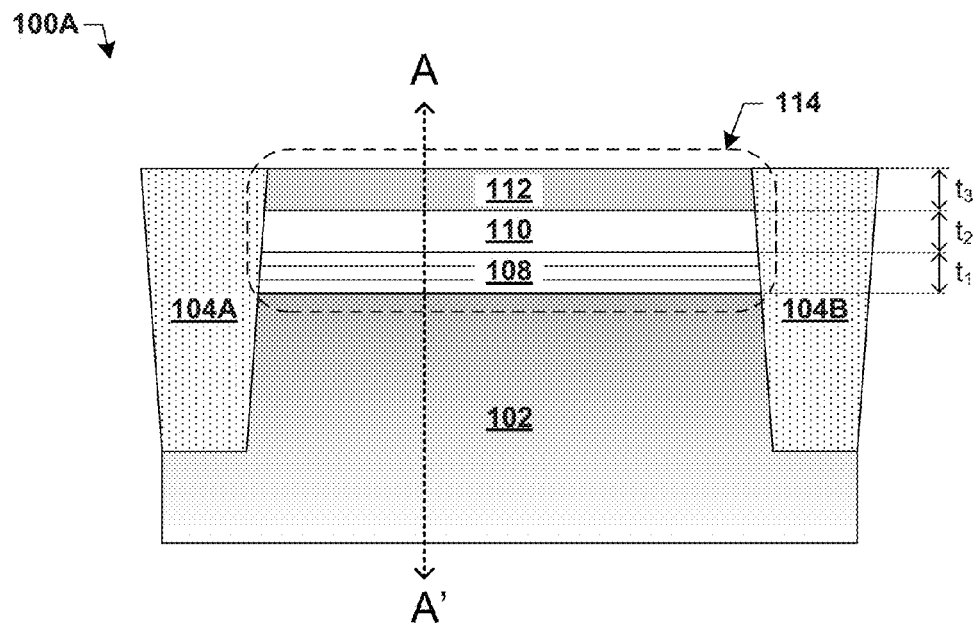
FIGS. 1A-1B illustrate cross-sectional views of some embodiments of transistor channels.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

As the minimum gate length of transistors within an IC continues to scale according to Moore's Law, the relative contribution of manufacturing variability to the performance of the IC increases. Manufacturing variability can result from impurities within the semiconductor substrate, non-uniform doping, overlay variability between two or more mask alignment steps, variable illumination conditions, etc. In some instances, manufacturing variability only impacts certain devices within the IC, while leaving others relatively unaffected, which can degrade electronic matching between the devices within the IC.

For instance, transistors formed on semiconductor substrates may be subject to drain-induced barrier lowering (DIBL). DIBL results in leakage between the source and drain of the transistors, and results from low channel doping or source/drain junctions that are too deep. The channel doping and location of the source/drain junctions may vary between transistors within the IC due to variable processing conditions across a surface of the IC. The variable processing conditions can therefore lead to variable leakage between transistors across the IC. This can result in poor gate control across the IC. To combat this global variation in leakage, a localized halo implant is utilized to increase channel dopant concentrations near the source/drain regions of the channels within the transistors. The higher doping in these regions reduces interaction between the source and drain without influencing the threshold voltage ($V_{th}$) of the transistors. However, the halo implant can cause local variations in the substrate structure, which can cause local variation in transistor performance. The net of these effects is poor electronic matching between the $V_{th}$ of the transistors across the IC.

Accordingly, some embodiments of the present disclosure relate to a transistor device that utilizes a channel configured to improve local and global variations between a plurality of such transistor devices disposed within an IC. In some embodiments, the channel is formed in a transistor region of a semiconductor substrate containing dopant impurities of a first impurity type. The channel is composed of a delta-doped layer also comprising dopant impurities of the first impurity type, and configured to produce a peak retrograde dopant concentration within the channel. The channel is further composed of a layer of carbon-containing material overlying the delta-doped layer, and configured to prevent back diffusion of dopants from the delta-doped layer and semiconductor substrate. The channel is also composed of a layer of substrate material overlying the layer of carbon-containing material, and configured to provide a low dopant concentration to achieve steep retrograde dopant profile a near a surface of the channel. In some embodiments, the channel is further composed of a counter-doped layer underlying the delta-doped layer. The counter-doped layer is composed of dopant impurities of a second impurity type, which is opposite the first impurity type. The counter-doped layer is configured to reduce leakage within the semiconductor substrate.

FIG. 1A illustrates a cross-sectional view of some embodiments of a first transistor channel 100A formed in a recess 114 laterally disposed between first and second shallow trench isolations (STI) 104A, 104B of a semiconductor substrate 102. The semiconductor substrate 102 has been doped with dopant impurities of a first impurity type (i.e., n-type or p-type). The first transistor channel 100A includes a delta-doped layer 108 having dopant impurities of the first impurity type disposed within the recess 114. In some embodiments, the delta-doped layer 108 has a first thickness $t_1$ in a range of about 2 nm to about 15 nm. In some embodiments, the delta-doped layer 108 is epitaxially disposed over a bottom surface of the recess 114 by an appropriate epitaxial deposition technique. In other embodiments, the delta-doped layer 108 includes a doped region of the semiconductor substrate 102 underlying a bottom surface of the recess 104, where the doped region is formed by an implantation technique (i.e., ion implantation). In some embodiments, the delta-doped layer 108 has a peak dopant concentration of about $2e19$ $cm^{-3}$ to provide a retrograde dopant concentration profile within the first transistor channel 100A.

The first transistor channel 100A further includes a layer of carbon-containing material 110 overlying the delta-doped layer 108. In some embodiments, the layer of carbon-containing material 110 is epitaxially disposed over a bottom surface of the delta-doped layer 108 by an appropriate epitaxial deposition technique. In some embodiments, the layer of carbon-containing material 110 has a second thickness $t_2$ in a range of about 2 nm to about 15 nm. The layer of carbon-containing material 110 is configured to prevent back-diffusion of dopants from the delta-doped layer 108 or semiconductor substrate 102. In some embodiments, the layer of carbon-containing material 110 comprises silicon carbide (SiC).

The first transistor channel 100A further includes a layer of substrate material 112 overlying the layer of carbon-containing material 110. In some embodiments, the layer of layer of substrate material 112 is epitaxially disposed over a bottom surface of the layer of carbon-containing material 110 by an appropriate epitaxial deposition technique. In some embodiments, the layer of substrate material 112 has a third thickness $t_3$ in a range of about 5 nm to about 30 nm. In some embodiments, the layer of substrate material 112 has a dopant concentration that is less than 1e18 $cm^{-3}$ at an interface between the layer of substrate material 112 and a gate structure disposed over a top surface of the layer of substrate material 112. In some embodiments, the substrate material comprises silicon.

Figure 1B:
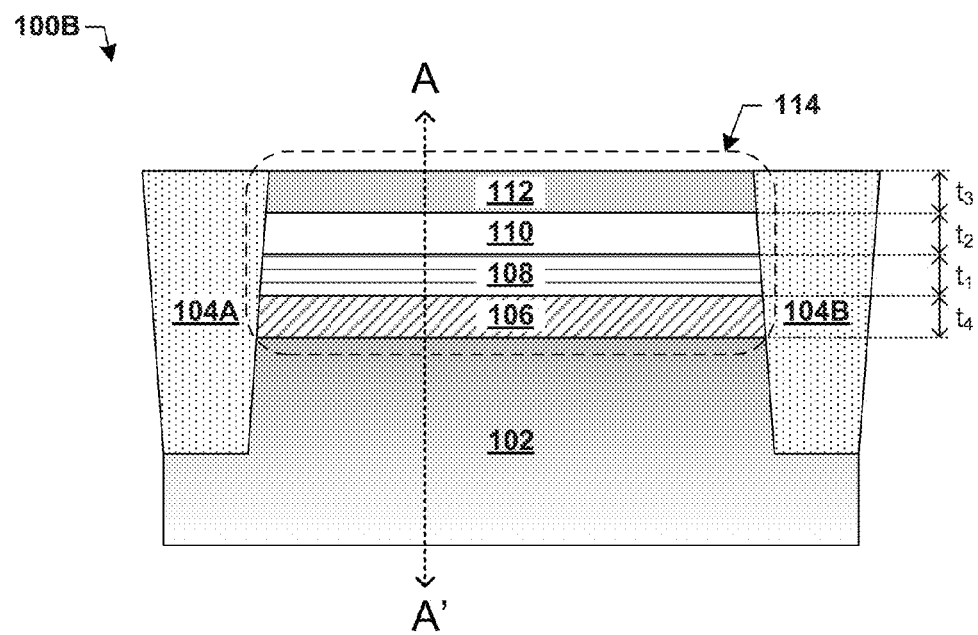

FIG. 1B illustrates a cross-sectional view of some embodiments of a second transistor channel 100B formed in a recess 114. The second transistor channel 100B includes a delta-doped layer 108, a layer of carbon-containing material 110, and a layer of substrate material 112, which are identical to those described in the embodiments of FIG. 1A. In addition, the second transistor channel 100B includes a counter-doped layer 106 including dopant impurities of a second impurity type (i.e., n-type or p-type, respectively), which is opposite the first impurity type (i.e., p-type or n-type, respectively). In some embodiments, the dopant impurities of the first or second impurity type comprise boron, carbon, indium, or combinations thereof, respectively. In such embodiments, the dopant impurities of the second or first impurity type comprise phosphorous, antimony, arsenic, or combinations thereof, respectively. The addition of the counter-doped layer 106 below the delta-doped layer 108 improves leakage current ($I_{boff}$) within the channel.

In some embodiments, the counter-doped layer 106 overlies the bottom surface of the recess 114 and underlies the delta-doped layer 108. In such embodiments, the counter-doped layer 106 is epitaxially disposed within the recess 114. In some embodiments, the counter-doped layer 106 is formed by a doped region of the semiconductor substrate 102, which underlies the bottom surface of the recess 114 as well as the delta-doped layer 108. In such embodiments, the delta-doped layer 108 may be epitaxially disposed over the counter-doped layer 106 (i.e., over a bottom surface of the recess). Alternatively, in such embodiments the delta-doped layer 108 may also comprise a doped region of the semiconductor substrate 102 overlying the counter-doped layer 106. In some embodiments, the counter-doped layer 106 has a fourth thickness $t_4$ in a range of about 2 nm to about 25 nm.

Figure 2:
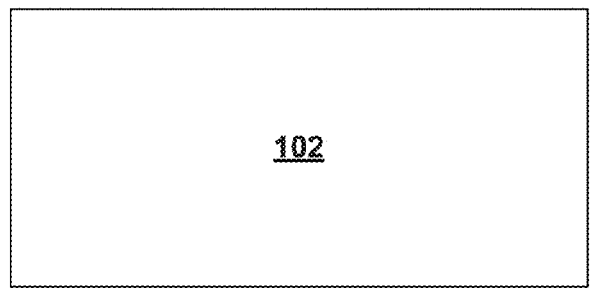
FIGS. 2-15 illustrate cross-sectional views of some embodiments of transistor formation.

FIGS. 2-15 illustrate cross-sectional views of some embodiments of transistor formation in accordance with the embodiments of the present disclosure. FIG. 2 illustrates a cross-sectional view of a semiconductor substrate 102.

Figure 3:
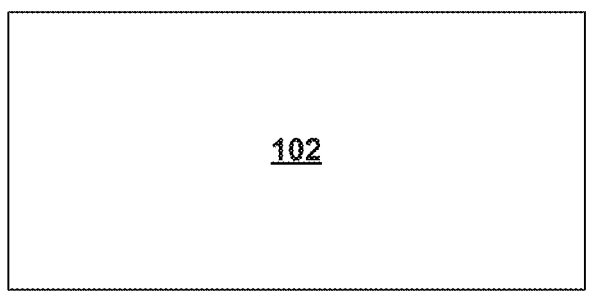

FIG. 3 illustrates a cross-sectional view of some embodiments of a transistor device 300, comprising the semiconductor substrate 102, where a well and $V_{th}$ implant 302 operation are used to introduce dopant impurities of a first impurity type into a transistor region of the semiconductor substrate 102. The $V_{th}$ implant introduces the impurities of the first impurity type into the transistor region to adjust the $V_{th}$ of a transistor formed in subsequent processing steps. In some embodiments, the dopant impurities include p-type dopant impurities such as boron, carbon, indium, etc. In other embodiments, the dopant impurities include n-type dopant impurities such as phosphorous, antimony, or arsenic, etc. In various embodiments, the $V_{th}$ implant uses an implant energy in a range of about 5 keV to about 150 keV.

Figure 4:
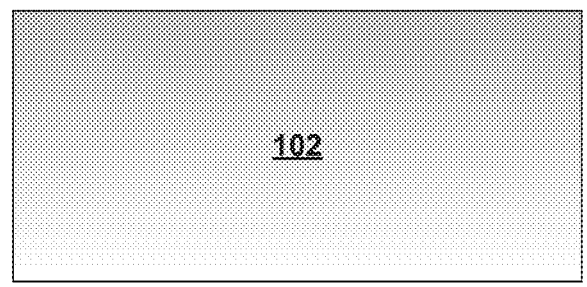

FIG. 4 illustrates a cross-sectional view of some embodiments of a transistor device 400, comprising the transistor device 300, where an annealing operation is used to activate the implanted dopants, to eliminate crystalline defects introduced during the well and $V_{th}$ implant 302, and promote diffusion and redistribution of dopant impurities within the semiconductor substrate 102. Various conventional annealing operations may be used and the annealing operations may drive the implanted dopant impurities deeper into the semiconductor substrate 102 as indicated by darkness gradient of the semiconductor substrate 102 in FIG. 4.

Figure 5:
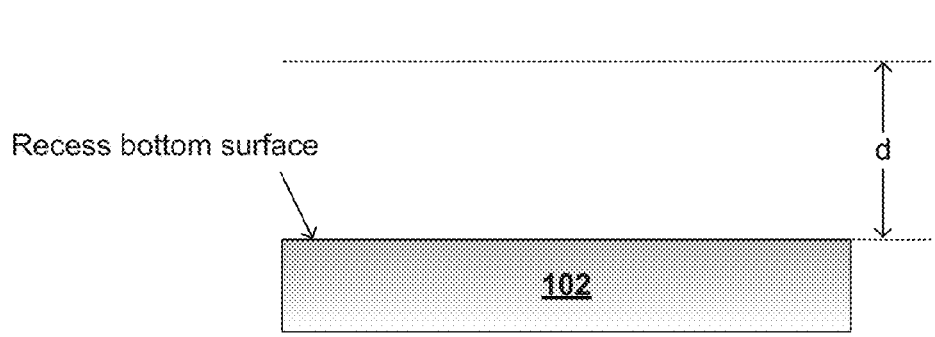

FIG. 5 illustrates a cross-sectional view of some embodiments of a transistor device 500, comprising the transistor device 400, which has been recessed to a depth (d) in the transistor region. In some embodiments, formation of the recess includes one or more etching process(es), including but not limited to a dry process(es) such as a plasma etching process, wet etching process(es), or a combination thereof.

Figure 6A:
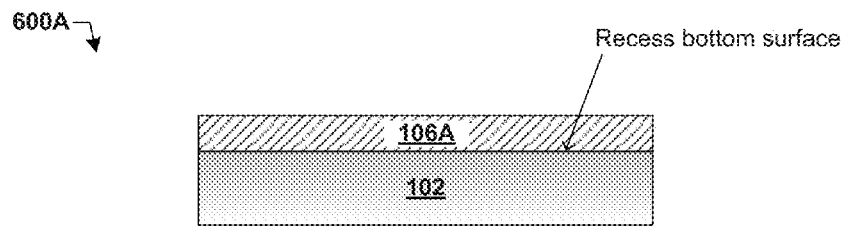
Figure 6B:
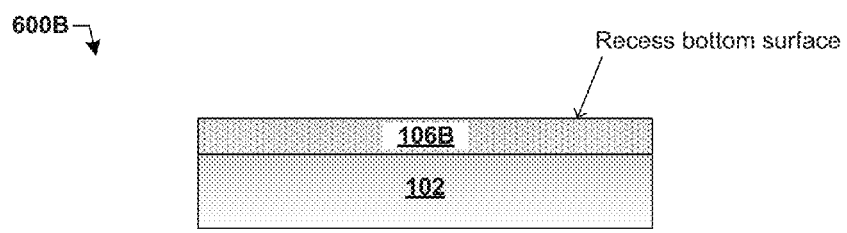
Figure 6C:
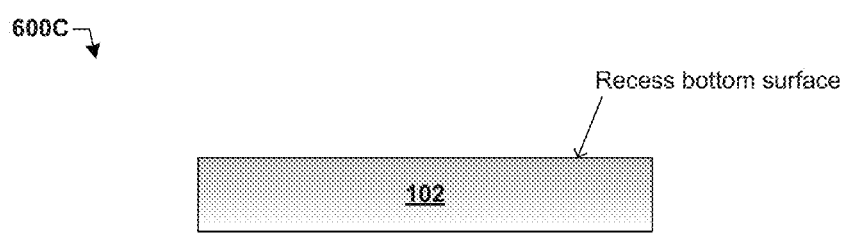

FIGS. 6A-6C illustrate various embodiments of counter-doped layer disposal on the semiconductor substrate 102. FIG. 6A illustrates a cross-sectional view of some embodiments of a transistor device 600A, comprising the transistor device 500, whereupon a first counter-doped layer 106A is epitaxially-disposed. The second impurity type is opposite the first impurity type. For the embodiments of FIG. 6A, the first counter-doped layer 106A overlies the bottom surface of the recess formed in the embodiments of FIG. 5.

FIG. 6B illustrates a cross-sectional view of some embodiments of a transistor device 600B, comprising the transistor device 500, where a second counter-doped layer 106B is formed through an implantation technique. The implantation technique introduces the dopant impurities of the second impurity type directly into the semiconductor substrate 102 such that the second counter-doped layer 106B underlies the bottom surface of the recess formed in the embodiments of FIG. 5. FIG. 6C illustrates a cross-sectional view of some embodiments of a transistor device 600C, comprising the transistor device 500, where no counter-doped layer is formed. Therefore, FIGS. 6A-6C illustrate three options for counter-doped layer disposal on the semiconductor substrate 102: an epitaxial layer, a doped region of the semiconductor substrate 102, or no counter-doped layer.

Figure 7A:
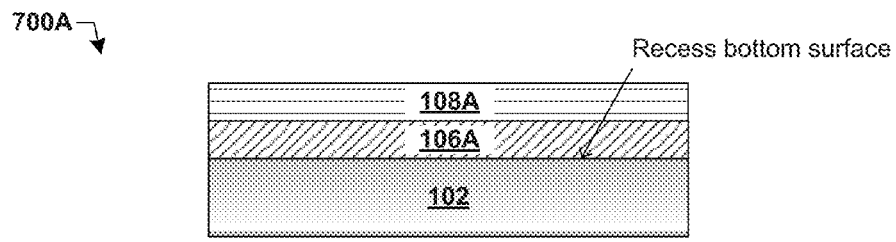

FIGS. 7A-7F illustrate various embodiments of delta-doped layer disposal on the transistor devices 600A-600C of FIGS. 6A-6C. FIG. 7A illustrates a cross-sectional view of some embodiments of a transistor device 700A, comprising the transistor device 600A, where a first delta-doped layer 108A containing dopant impurities of the first impurity type has been epitaxially-disposed over the first counter-doped layer 106A by an appropriate epitaxial technique.

Figure 7B:
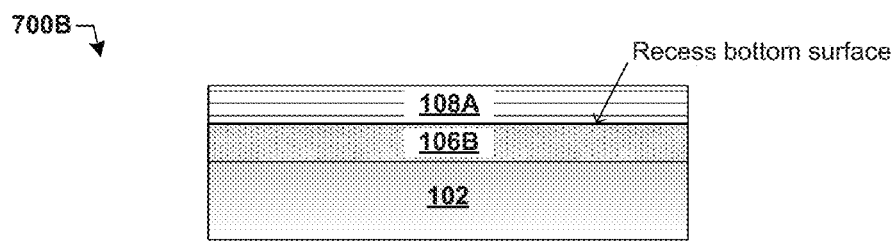

FIG. 7B illustrates a cross-sectional view of some embodiments of a transistor device 700B, comprising the transistor device 600B, the first delta-doped layer 108A has been epitaxially-disposed over the second counter-doped layer 106B by an appropriate epitaxial technique.

Figure 7C:
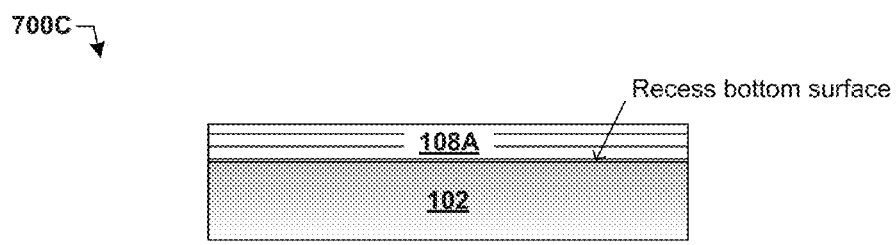

FIG. 7C illustrates a cross-sectional view of some embodiments of a transistor device 700C, comprising the transistor device 600C, where the first delta-doped layer 108A containing dopant impurities of the first impurity type has been epitaxially-disposed over the bottom surface of the recess by an appropriate epitaxial technique. The first delta-doped layer 108A includes a peak dopant concentration of about 1e19 $cm^{-3}$.

Figure 7D:
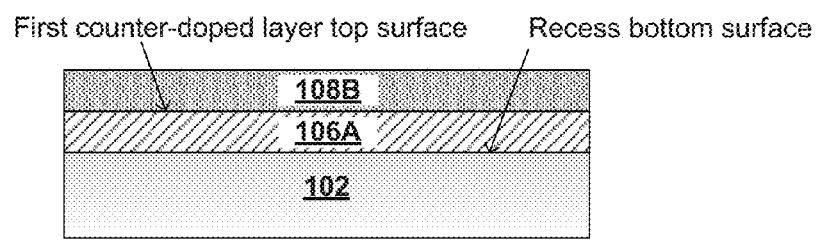

FIG. 7D illustrates a cross-sectional view of some embodiments of a transistor device 700D, comprising the transistor device 600A, where a second delta-doped layer 108B containing dopant impurities of the first impurity type has been formed underlying a top surface of the first counter-doped layer 106A by an implantation technique. As a result, the second delta-doped layer 108B is formed within a top portion of the first counter-doped layer 106A.

Figure 7E:
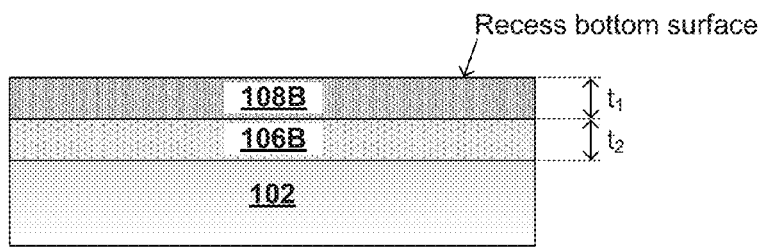

FIG. 7E illustrates a cross-sectional view of some embodiments of a transistor device 700E, comprising the transistor device 600B, where the second delta-doped layer 108B has also been formed underlying a top surface of the recess by an implantation technique. As a result, the second counter-doped layer 106B and the second delta-doped layer 108B are formed within the semiconductor substrate 102. For the embodiments of FIG. 7E, the second counter-doped layer 106B has been formed with an implant which penetrates the semiconductor substrate 102 to a depth which is greater than a first thickness ($t_1$) of the second delta-doped layer 108B, and forms the second counter-doped layer 106B with a second thickness ($t_2$).

Figure 7F:
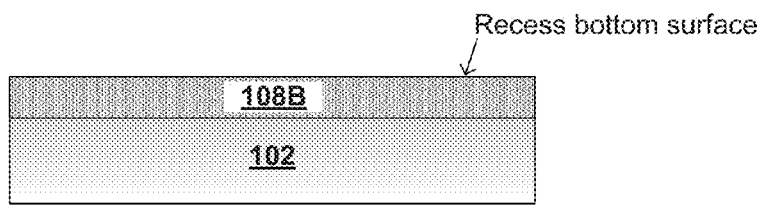

FIG. 7F illustrates a cross-sectional view of some embodiments of a transistor device 700F, comprising the transistor device 600C, where the second delta-doped layer 108B containing dopant impurities of the first impurity type has been formed underlying the bottom surface of the recess by an appropriate implantation technique.

Therefore, FIGS. 7A-7F illustrate six options for delta-doped layer disposal on the counter-doped layer or semiconductor substrate 102, resulting from the three options for counter-doped layer disposal of FIGS. 6A-6C. The six options include: an epitaxial layer formed on an epitaxial layer (700A), an epitaxial layer formed on a doped region of the semiconductor substrate 102 (700B), an epitaxial layer formed directly on the semiconductor substrate 102 with no counter-doped layer (700C), a doped region formed within an epitaxial layer (700D), a first doped region of the semiconductor substrate 102 formed below a second doped region of the semiconductor substrate 102 (700E), or a doped region of the semiconductor substrate 102 with no counter-doped layer (700F). Any of these six combinations are suitable for subsequent processing in FIGS. 8-15. However, only the embodiments of the transistor device 700A are illustrated for these subsequent processing steps. The others follow by analogy.

Figure 8:
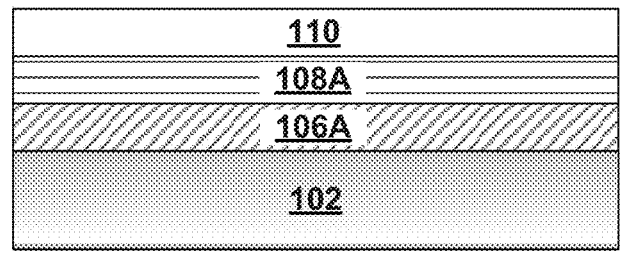

FIG. 8 illustrates a cross-sectional view of some embodiments of a transistor device 800, comprising the transistor device 700A, where a layer of carbon-containing material 110 is disposed over the first delta-doped layer 108A. In some embodiments, the layer of carbon-containing material 110 includes silicon carbide (SiC). The layer of carbon-containing material 110, which may also be referred to as a diffusion barrier layer, mitigates back diffusion of dopants from the well region of the semiconductor substrate 102 to subsequently formed epitaxial layers.

Figure 9:
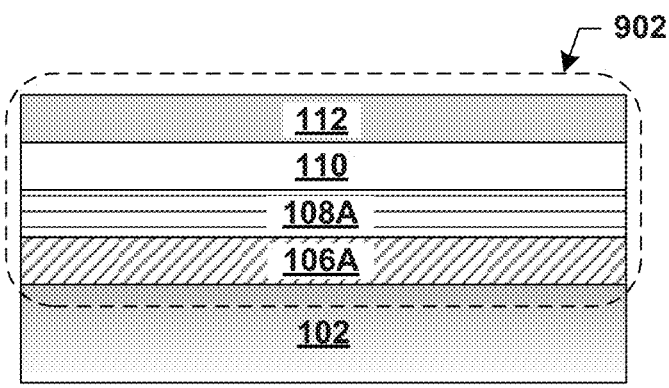

FIG. 9 illustrates a cross-sectional view of some embodiments of a transistor device 900, comprising the transistor device 800, where a layer of substrate material 112 is disposed over the layer of carbon-containing material 110. In some embodiments, the layer of substrate material 112 includes silicon (Si) disposed by an appropriate epitaxial technique. The carbon-containing material 110 mitigates back diffusion of the well and $V_{th}$ dopants from the semiconductor substrate 102 into the layer of substrate material 112. This results in a steep retrograde doping profile within a channel of the transistor device including a relatively low surface dopant concentration (e.g., less than 1e18 $cm^{-3}$) at a surface of the layer of substrate material 112. The low surface dopant concentration and retrograde dopant profile improve device performance by mitigating local and global dopant variations in a channel 902 formed by the first counter-doped layer 106A, the first delta-doped layer 108A, carbon-containing material 110, and the layer of substrate material 112.

Figure 10:
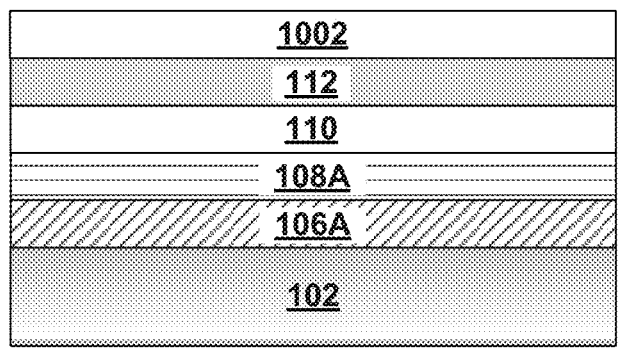

FIG. 10 illustrates a cross-sectional view of some embodiments of a transistor device 1000, comprising the transistor device 900, where a gate dielectric 1002 is disposed over the layer of substrate material 112. In some embodiments, gate dielectric 1002 includes an oxide layer such as silicon dioxide ($SiO_2$). Formation of such an oxide layer utilizes an oxidation process, which is performed at an elevated temperature. It is appreciated that the elevated temperature of the oxidation process may enhance back diffusion of dopants from the well region into the overlying epitaxial layers. However, the carbon-containing material 110 mitigates such back diffusion, resulting in a steep retrograde doping profile within the channel.

Figure 11:
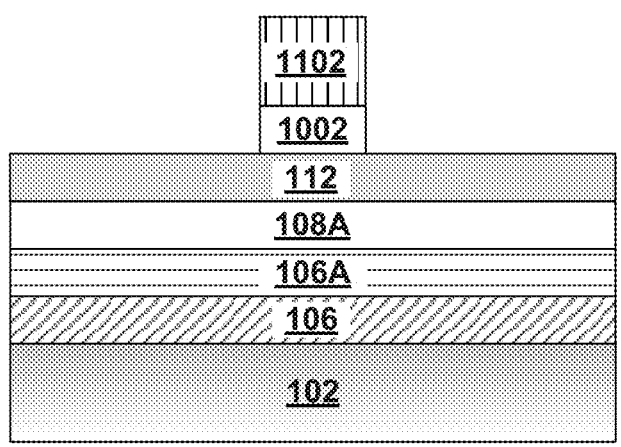

FIG. 11 illustrates a cross-sectional view of some embodiments of a transistor device 1100, comprising the transistor device 1000, where a gate electrode 1102 (e.g., polysilicon) is disposed over the gate dielectric 1002. The gate electrode 1102 and the gate dielectric 1002 are then patterned by a suitable lithography method including, but to, optical lithography, multiple patterning (MP) optical lithography (e.g., double-patterning), deep ultraviolet (UV) lithography, extreme UV (EUV) lithography, or other suitable patterning technique.

Figure 12:
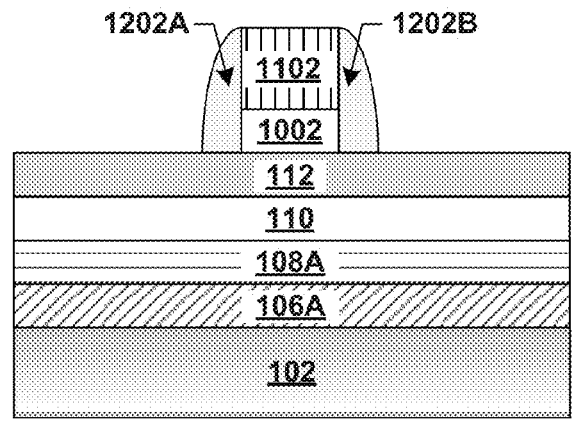

FIG. 12 illustrates a cross-sectional view of some embodiments of a transistor device 1200, comprising the transistor device 1100, where first and second spacers 1202A, 1202B are formed on either side of the patterned gate electrode 1102 and the gate dielectric 1002. In various embodiments, the first and second spacers 1202A, 1202B include combinations of oxide, silicon, and nitride.

Figure 13:
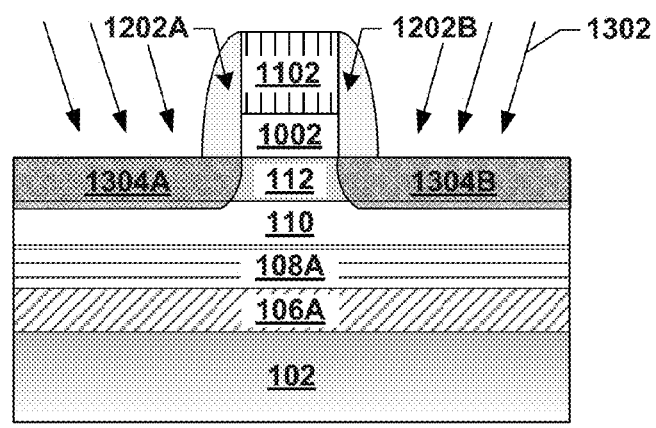

FIG. 13 illustrates a cross-sectional view of some embodiments of a transistor device 1300, comprising the transistor device 1200, where a lightly-doped-drain (LDD) implant 1302 is performed after patterning of the gate electrode 1102 and the gate dielectric 1002 to form first and second LDD regions 1304A, 1304B. The LDD implant 1302 utilizes dopants of a second impurity type, which is opposite the first impurity type of the well and $V_{th}$ implants shown in FIG. 3. For the embodiments of FIGS. 2-15, the first and second LDD regions 1304A, 1304B are n-type (e.g., phosphorous, antimony, or arsenic, etc) and the well and $V_{th}$ implants 304 utilizes p-type (e.g., boron, carbon, indium, etc.).

Figure 14:
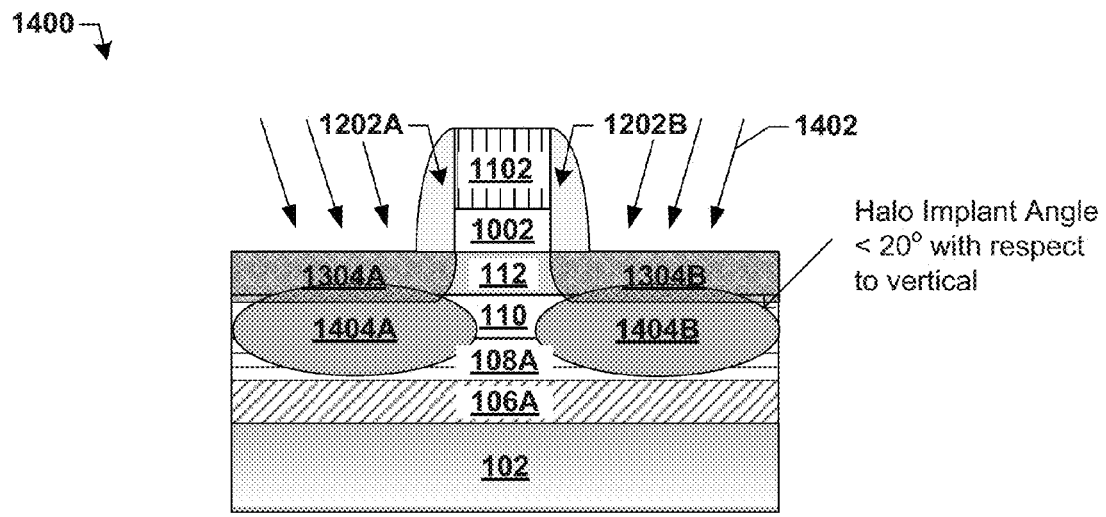

FIG. 14 illustrates a cross-sectional view of some embodiments of a transistor device 1400, comprising the transistor device 1300, where a halo implant 1402 is performed after the LDD implant 1302. The halo implant 1402 introduces dopant impurities of the first impurity type (i.e., same as the well and $V_{th}$ implants 304) into first and second highly-doped regions 1404A, 1404B on opposite edges the channel. In one exemplary embodiment, the halo implant 1402 is used to introduce a mixture of indium and carbon. In another exemplary embodiment, the halo implant 1402 is used to introduce indium, boron, or $BF_2$ into the first and second highly-doped regions 1404A, 1404B.

Figure 15:
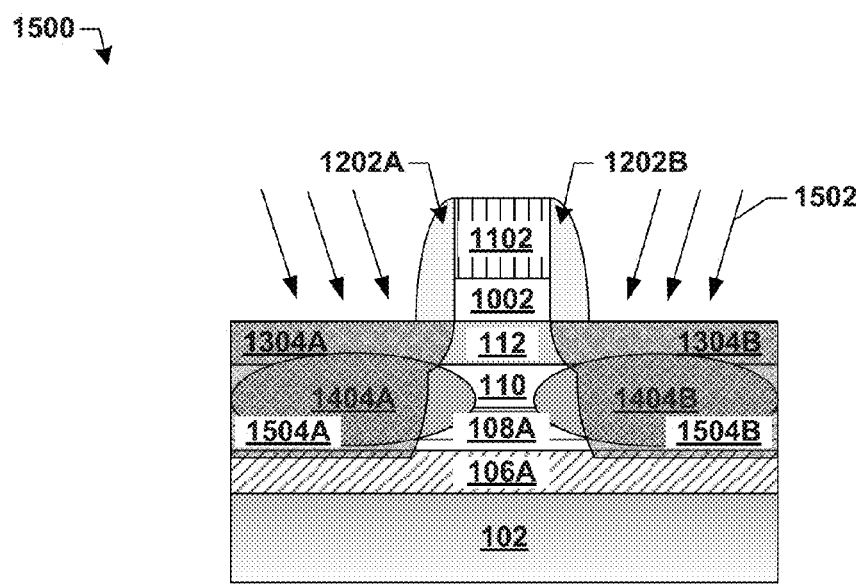

FIG. 15 illustrates a cross-sectional view of some embodiments of a transistor device 1500, comprising the transistor device 1400, where a source/drain implant 1502 is performed to form first and second source/drains regions 1504A, 1504B. The first and second source/drains regions 1504A, 1504B include the second impurity type (i.e., the same as first counter-doped layer 106A). In some embodiments, the first and second source/drains regions 1504A, 1504B can be formed by epitaxial growth.

Note that the embodiments of FIGS. 2-15 may apply to a p-type MOSFET or an n-type MOSET by reversing the dopant types.

Figure 16:
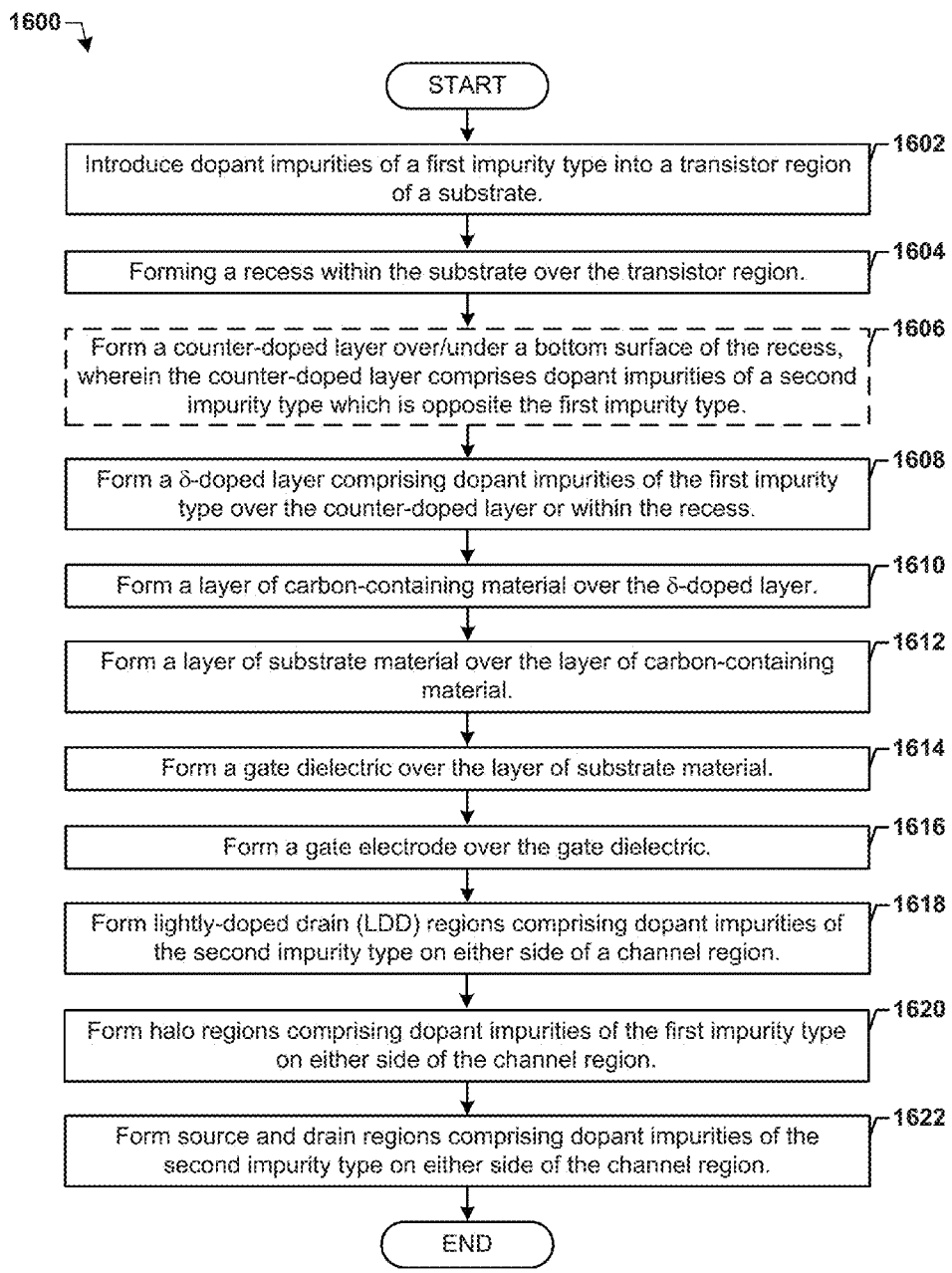
FIG. 16 illustrates some embodiments of a method of transistor formation.

FIG. 16 illustrates some embodiments of a method 1600 of transistor formation. While the method 1600 is described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602 dopant impurities of a first impurity type are introduced into a transistor region of a semiconductor substrate, where the transistor region includes a channel region and source/drain regions. In some embodiments, an anneal is performed after introducing the dopant impurities of a first impurity type into the transistor region.

At 1604 the substrate is recessed over the transistor regions.

At 1606 a counter-doped layer, comprising dopant impurities of a second impurity type, which is opposite the first impurity type, may be optionally formed. In some embodiments, the counter-doped layer is formed overlying a bottom surface of the recess by epitaxially disposing the counter-doped layer over a bottom surface of the recess. In some embodiments, the counter-doped layer is alternatively formed by implanting dopant impurities of the second impurity type into the bottom surface of the recess, such that the counter-doped layer comprises a doped region of the semiconductor substrate. In some embodiments, no counter-doped layer is formed.

At 1608 a delta-doped layer comprising dopant impurities of the first impurity type is formed over the counter-doped layer within the recess, or simply within the recess if no counter-doped layer was formed at 1606. In some embodiments, forming the delta-doped layer comprises epitaxially disposing the delta-doped layer over a bottom surface of the recess. In some embodiments, forming the delta-doped layer comprises implanting dopant impurities of the first impurity type into a bottom surface of the recess such that the delta-doped layer comprises a doped region of the semiconductor substrate.

At 1610 a layer of carbon-containing material (e.g., SiC) is formed over the delta-doped layer by an epitaxial deposition technique.

At 1612 an undoped layer of substrate material (e.g., Si) is formed over the layer of carbon-containing material by an epitaxial deposition technique.

At 1614 a gate dielectric (e.g., $SiO_2$) is formed over the layer of substrate material.

At 1616 a gate electrode (e.g., polysilicon) is formed over the gate dielectric and patterned to form a gate of the transistor.

At 1618 a lightly-doped drain (LDD) regions are formed on either side of a channel and comprise dopant impurities of the second impurity type.

At 1620 a halo implant is performed to form halo regions comprising dopant impurities of the first impurity type on either side of the channel.

At 1622 source and drain regions comprising dopant impurities of the second impurity type are formed on either side of the channel.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, in some embodiments, the present disclosure relates to a transistor device. An opening is arranged in a semiconductor substrate with a bottom surface below an upper surface of the semiconductor substrate. A carbon-containing layer is arranged over a delta-doped layer. A semiconductor layer is arranged in the opening, over the carbon-containing layer. A gate structure is arranged over the semiconductor layer. A source region and a drain region are laterally spaced on opposing sides of the opening.

Also, in some embodiments, the present disclosure relates to a method of forming a transistor device. An opening is formed by recessing a region of a semiconductor substrate to below an upper surface of the semiconductor substrate. A delta-doped layer is formed. A carbon-containing layer is formed confined to the opening and overlying the delta-doped layer. A semiconductor layer is formed in the opening, overlying the carbon-containing layer. A gate structure is formed overlying the semiconductor layer.

Also, in some embodiments, the present disclosure relates to a transistor device. An opening is arranged in a well region of a semiconductor substrate that is doped with impurities. A diffusion barrier layer is confined to the opening and arranged over a delta-doped layer that is doped with impurities having a same type as the impurities of the semiconductor substrate. An undoped semiconductor layer is arranged over the diffusion barrier layer. A gate structure is arranged over the semiconductor layer. A source region and a drain region are laterally spaced on opposing sides of the opening.

Also, in some embodiments, the present disclosure relates to a transistor device that utilizes a channel configured to improve local and global variations between a plurality of such transistor devices disposed within an IC. In some embodiments, the channel is formed in a transistor region of a semiconductor substrate containing dopant impurities of a first impurity type. The channel is composed of a delta-doped layer also comprising dopant impurities of the first impurity type, and configured to produce a peak retrograde dopant concentration within the channel. The channel is further composed of a layer of carbon-containing material overlying the delta-doped layer, and configured to prevent back diffusion of dopants from the delta-doped layer and semiconductor substrate. The channel is also composed of a layer of substrate material overlying the layer of carbon-containing material, and configured to provide a low dopant concentration to achieve steep retrograde dopant profile a near a surface of the channel. In some embodiments, the channel is further composed of a counter-doped layer underlying the delta-doped layer. The counter-doped layer is composed of dopant impurities of a second impurity type, which is opposite the first impurity type. The counter-doped layer is configured to reduce leakage within the semiconductor substrate.

Also, in some embodiments, the present disclosure relates to a transistor device, comprising a recess disposed within a transistor region of the semiconductor substrate, wherein the transistor region is doped with dopant impurities of a first impurity type. The transistor device further comprises a channel region comprising a delta-doped layer comprising dopant impurities of the first impurity type disposed within the recess, a layer of carbon-containing material overlying the delta-doped layer, and a layer of substrate material overlying the layer of carbon-containing material. The transistor device further comprises a gate structure disposed over the channel region. In some embodiments, a counter-doped layer comprising dopant impurities of a second impurity type, which is opposite the first impurity type, underlies the delta-doped layer.

Also, in some embodiments, the present disclosure relates to a method of forming a transistor device on a semiconductor substrate. The method comprises introducing dopant impurities of a first impurity type into a transistor region of the semiconductor substrate, and forming a recess within the substrate over the transistor region. The method further comprises forming a delta-doped layer comprising dopant impurities of the first impurity type within the recess, forming a layer of carbon-containing material overlying the delta-doped layer, and forming a layer of substrate material overlying the layer of carbon-containing material. In some embodiments, the method further comprises forming a counter-doped layer comprising dopant impurities of a second impurity type, which is opposite the first impurity type, underlying the delta-doped layer.

Also, in some embodiments, the present disclosure relates to a method of forming a transistor device on a semiconductor substrate. The method comprises introducing dopant impurities of a first impurity type into a transistor region of the semiconductor substrate and forming a recess within the substrate over the transistor region. The method further comprises forming a delta-doped layer comprising dopant impurities of the first impurity type within the recess, forming a layer of carbon-containing material over the delta-doped layer, and forming a layer of a layer of substrate material over the layer of carbon-containing material. The method further comprises forming a gate dielectric over the layer of substrate material and forming a gate electrode over the gate dielectric. The method further comprises forming lightly-doped drain (LDD) regions comprising dopant impurities of a second impurity type, which is opposite the first impurity type on either side of a channel region comprising the delta-doped layer, layer of carbon-containing material, and layer of substrate material. The method further comprises forming halo regions comprising dopant impurities of the first impurity type on either side of the channel region, and forming source and drain regions comprising dopant impurities of the second impurity type on either side of the channel region. In some embodiments, the method further comprises forming a counter-doped layer comprising dopant impurities of a second impurity type, which is opposite the first impurity type, underlying the delta-doped layer.

What is claimed is:

1. A transistor device, comprising:
a recess arranged in a semiconductor substrate with a bottom surface below an upper surface of the semiconductor substrate;
a carbon-containing layer arranged over a delta-doped layer;
a semiconductor layer arranged in the recess, over the carbon-containing layer and the bottom surface of the recess;
a gate structure arranged over the semiconductor layer; and
a source region and a drain region laterally spaced on opposing sides of the recess.

2. The transistor device according claim 1, wherein the delta-doped layer is an epitaxial layer confined to the recess, and wherein opposite sidewalls of the delta-doped layer respectively contact opposite sidewalls of the recess.

3. The transistor device according to claim 1, further comprising:
a counter-doped layer underlying the delta-doped layer, wherein the counter-doped layer is doped with impurities of an opposite type as impurities of the delta-doped layer.

4. The transistor device according to claim 3, wherein the counter-doped layer is an epitaxial layer confined to the recess.

5. The transistor device according to claim 1, wherein the semiconductor layer is confined to the recess.

6. The transistor device according to claim 1, wherein the semiconductor layer is silicon and the carbon-containing layer is silicon carbide.

7. The transistor device according to claim 1, wherein the semiconductor layer is undoped.

8. The transistor device according to claim 1, wherein footprints of the carbon-containing layer, the delta-doped layer, the semiconductor layer, and the recess are substantially the same.

9. The transistor device according to claim 1, further comprising:
a shallow trench isolation (STI) region arranged on opposing sides of the recess, wherein the bottom surface of the recess is arranged below an upper surface of the STI region, and wherein heights of the STI region respectively on the opposing sides are the same.

10. The transistor device according to claim 1, wherein the recess is arranged in a region of the semiconductor substrate that is doped with a same type of impurities as impurities of the delta-doped layer.

11. A method of forming a transistor device, comprising:
forming a recess by etching a region of a semiconductor substrate to below an upper surface of the semiconductor substrate;
after forming the recess, forming a delta-doped layer;
forming a carbon-containing layer confined to the recess and overlying the delta-doped layer;
forming a semiconductor layer in the recess, overlying the carbon-containing layer; and
forming a gate structure overlying the semiconductor layer.

12. The method according to claim 11, further comprising:
forming the delta-doped layer confined to the recess using an epitaxial deposition process.

13. The method according to claim 11, further comprising:
   forming a counter-doped layer underlying the delta-doped layer and doped with impurities of an opposite type as impurities of the delta-doped layer.

14. The method according to claim 13, further comprising:
   forming the counter-doped layer confined to the recess using an epitaxial deposition process.

15. The method according to claim 11, further comprising:
   forming the semiconductor layer confined to the recess using an epitaxial deposition process.

16. The method according to claim 11, further comprising:
   forming the recess by etching the region to below an upper surface of a shallow trench isolation (STI) region arranged on opposing sides of the recess.

17. The method according to claim 11, further comprising:
   implanting dopant impurities having a same type as dopant impurities of the delta-doped layer into the region of the semiconductor substrate; and
   annealing the semiconductor substrate.

18. The method according to claim 11, further comprising:
   forming a source region and a drain region laterally spaced on opposing sides of the recess.

19. A transistor device, comprising:
   a recess arranged in a well region of a semiconductor substrate that is doped with impurities;
   a diffusion barrier layer confined to the recess and arranged over a delta-doped layer that is doped with impurities having a same type as the impurities of the semiconductor substrate, wherein the diffusion barrier layer comprises opposite sidewall surfaces that respectively contact opposite sidewall surfaces of the recess over a bottom surface of the recess;
   an undoped semiconductor layer arranged over the diffusion barrier layer;
   a gate structure arranged over the semiconductor layer; and
   a source region and a drain region laterally spaced on opposing sides of the recess.

20. The transistor device according to claim 19, wherein a whole of the diffusion barrier layer is arranged within the recess.

* * * * *